US006882586B2

(12) United States Patent
Sato et al.

(10) Patent No.: US 6,882,586 B2
(45) Date of Patent: Apr. 19, 2005

(54) SEMICONDUCTOR MEMORY DEVICE EQUIPPED WITH CONTROL CIRCUIT FOR CONTROLLING MEMORY CELL ARRAY IN NON-NORMAL OPERATION MODE

(75) Inventors: Hirotoshi Sato, Tokyo (JP); Masaki Tsukude, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 377 days.

(21) Appl. No.: 10/267,670

(22) Filed: Oct. 10, 2002

(65) Prior Publication Data

US 2003/0198116 A1 Oct. 23, 2003

(30) Foreign Application Priority Data

Apr. 15, 2002 (JP) ...................................... 2002-111948

(51) Int. Cl.$^7$ ................................................ G11C 7/00
(52) U.S. Cl. ...................... 365/201; 365/194; 365/195; 365/222
(58) Field of Search ................................ 365/201, 222, 365/194, 195

(56) References Cited

U.S. PATENT DOCUMENTS 5,925,141 A * 7/1999 Ariki .......................... 714/718
6,522,589 B1 * 2/2003 Miyakawa et al. .... 365/189.07
6,707,736 B1 * 3/2004 Miyakawa et al. ......... 365/201
6,741,511 B1 * 5/2004 Nakao ........................ 365/201

OTHER PUBLICATIONS

U.S. Appl. No. 09/973,894, filed Oct. 11, 2001, Sato et al., U.S. Pat 6,795,943.
U.S. Appl. No. 10/120,445, filed Apr. 12, 2002, Makabe et al., U.S. Pat 6,707,735.

* cited by examiner

Primary Examiner—Tan T. Nguyen
(74) Attorney, Agent, or Firm—McDermott Will & Emery LLP

(57) ABSTRACT

A semiconductor memory device is provided with a memory cell array including memory cells being arranged in a shape of matrix and requiring a refresh operation. In the semiconductor memory device, a control circuit controls a timing of the refresh operation in accordance with an internal signal independently of an external signal and controlling the memory cell array in a non-normal operation mode different from a normal operation mode for writing data into the memory cell array and reading out data from the memory cell array. The control circuit starts the non-normal operation mode in response to a sequence of entry into the non-normal operation mode based on a predetermined first command signal, sets the non-normal operation mode in response to a sequence of setting the non-normal operation mode based on a predetermined second command signal, and thereafter, executes operation of the corresponding non-normal operation mode which is set.

8 Claims, 12 Drawing Sheets

MEMORY CELL ARRAY ACTIVATOR CIRCUIT 156

REFRESH ACTIVATOR CIRCUIT 158

CME SHIFTER CIRCUIT 155

INTERNAL CONTROL SIGNAL GENERATOR CIRCUIT 153

OPERATION OF REFRESH ACTIVATOR CIRCUIT 158 IN NORMAL OPERATION MODE

SEMICONDUCTOR MEMORY DEVICE EQUIPPED WITH CONTROL CIRCUIT FOR CONTROLLING MEMORY CELL ARRAY IN NON-NORMAL OPERATION MODE

BACKGROUND OF THE INVENTION

1. Field of the Invention

The present invention relates to a semiconductor memory device such as a pseudo static random access memory (pseudo SRAM), and in particular, to a semiconductor memory device provided with a control circuit for controlling a memory cell array in a non-normal operation mode, such as a test mode and a command mode, which is different from a normal operation mode for executing writing data into the memory cell array and reading out data from the memory cell array.

2. Description of the Prior Art

According to a prior art technique, a semiconductor memory device such as DRAM, which has a test mode and a command mode besides the normal operation mode, is constructed so as to operate in the normal operation mode in a state on the way to entry into the test mode or the command mode.

In the prototype stage of a so-called pseudo SRAM, which has DRAM type memory cells of the prior art technique and operates with each memory cell refresh timing decided internally independently of a signal from an external apparatus, the present inventor and others discovered the possibility of occurrence of destroyed cases when data are written into the memory cell array while operating in the normal operation mode in the state on the way to the entry into the test mode or the command mode. Moreover, in this case, there is such a problem that a control circuit sometimes becomes a freeze state due to timing shifts among a plurality of internal control signals.

SUMMARY OF THE INVENTION

An essential object of the present invention is to solve the aforementioned problems and provide a semiconductor memory device, capable of preventing results of write in the normal operation from being destroyed even in the state on the way to the entry into the operation mode, such as the test mode or the command mode, which is different from the normal operation mode.

In order to achieve the aforementioned objective, according to one aspect of the present invention, there is provided a semiconductor memory device equipped with a memory cell array including memory cells being arranged in a shape of matrix and requiring a refresh operation. In the semiconductor memory device, a control means controls a timing of the refresh operation in accordance with an internal signal independently of an external signal and controlling the memory cell array in a non-normal operation mode different from a normal operation mode for writing data into the memory cell array and reading out data from the memory cell array. The control means starts the non-normal operation mode in response to a sequence of entry into the non-normal operation mode based on a predetermined first command signal, sets the non-normal operation mode in response to a sequence of setting the non-normal operation mode based on a predetermined second command signal, and thereafter, executes operation of the corresponding non-normal operation mode which is set.

In the above-mentioned semiconductor memory device, the control means preferably controls the memory cell array so as to release the non-normal operation mode by executing a non-normal operation mode release process based on a predetermined third command signal and so as to prohibit an enabling process for enabling the memory cell array during an interval when the non-normal operation mode is set.

In the above-mentioned semiconductor memory device, the non-normal operation mode is a test mode, and the control means preferably resets the test mode after a lapse of a predetermined delay time from the timing when the test mode is released by the test mode release process.

In the above-mentioned semiconductor memory device, the non-normal operation mode is a command mode, and the control means preferably prohibits from writing data into the memory cell array and from reading out data from the memory cell array during an interval when the command mode is set.

In the above-mentioned semiconductor memory device, the control means preferably prohibits a refresh process for the memory cell array during an interval when the command mode is set.

In the above-mentioned semiconductor memory device, the control means preferably starts the command mode in response to a sequence of entry into the command mode based on a predetermined fourth command signal, generates an address mask signal in response to the start of the command mode, and prohibits transmission of a chip enable signal and address data to an internal circuit of the semiconductor memory device in accordance with the address mask signal.

In the above-mentioned semiconductor memory device, the control means preferably includes a memory cell array activator circuit having a first set-reset type flip-flop circuit. In this case, the control means preferably starts the non-normal operation mode by setting the first set-reset type flip-flop circuit in response to the sequence of entry into the non-normal operation mode based on the predetermined first command signal, thereafter sets the non-normal operation mode by resetting the first set-reset type flip-flop circuit in response to the sequence of setting the non-normal operation mode based on a predetermined second command signal and subsequently prohibits the activation process for the memory cell array during the interval when the non-normal operation mode is set.

In the above-mentioned semiconductor memory device, the control means preferably includes a refresh activator circuit having a second set-reset type flip-flop circuit. In this case, the control means preferably starts the command mode by setting the second set-reset type flip-flop circuit in response to the sequence of entry into the command mode based on the predetermined fourth command signal, thereafter prohibits the refresh process of the memory cell array, and restarts the refresh process of the memory cell array by resetting the second set-reset type flip-flop circuit when the command mode is released.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Preferred embodiments of the present invention will be described below with reference to the drawings.

Figure 1:
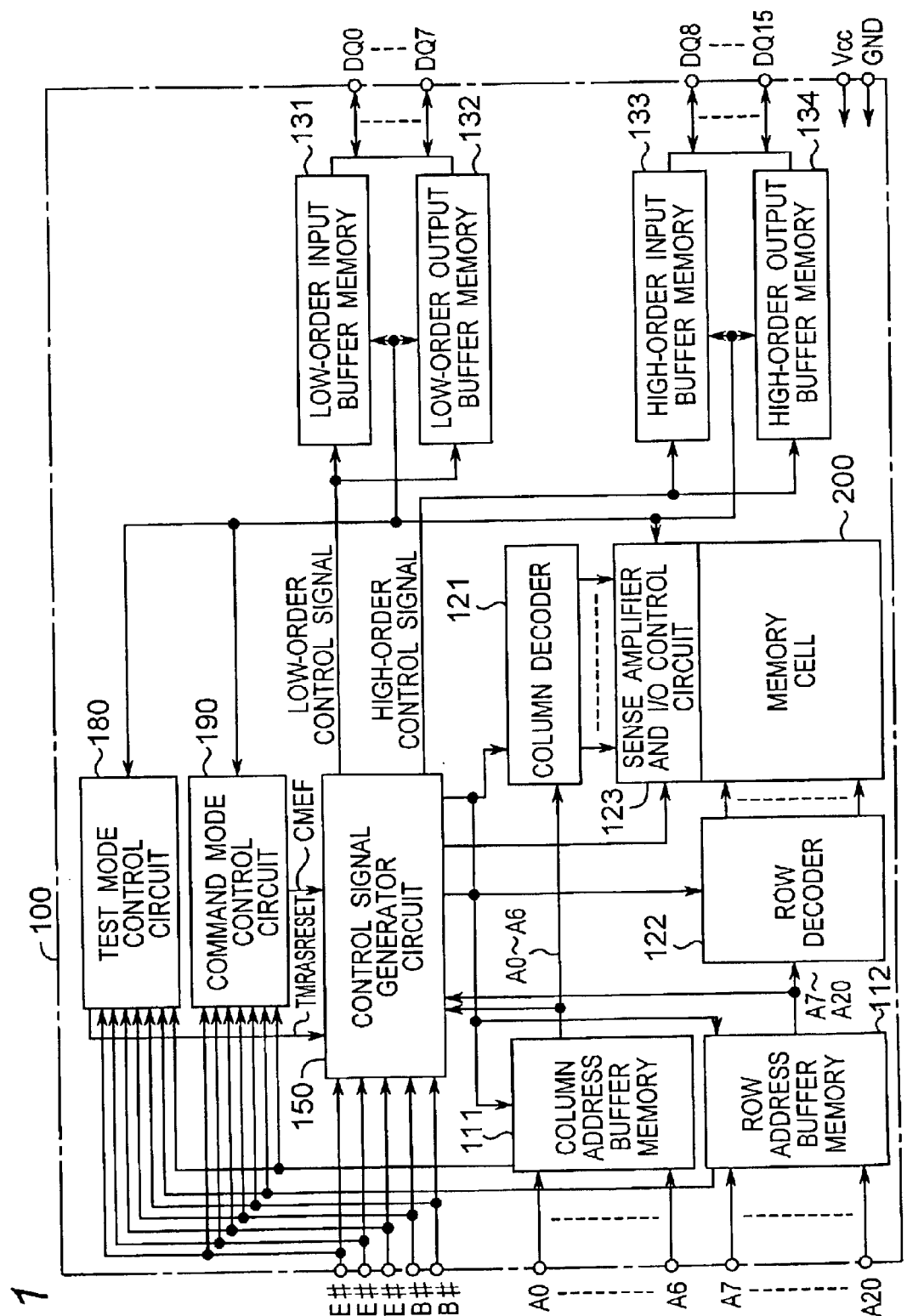
FIG. 1 is block diagram showing a construction of a semiconductor memory device 100 according to one preferred embodiment of the present invention.

FIG. 1 is a block diagram showing a construction of a semiconductor memory device 100 according to one preferred embodiment of the present invention. The semiconductor memory device 100 of FIG. 1 is a so-called "pseudo SRAM", which is provided with a DRAM type memory cell array 200 and has an I/O interface (Input and Output interface) compatible with the asynchronous type SRAM. The semiconductor memory device 100 is characterized by including, in particular, a control signal generator circuit 150, a test mode control circuit 180 and a command mode control circuit 190.

First of all, the construction of the semiconductor memory device 100 will be described with reference to FIG. 1.

Referring to FIG. 1, the semiconductor memory device 100 is provided with a DRAM type memory cell array 200 constructed of a plurality of memory cells. Each memory cell is the DRAM type whose I/O interface is compatible with the asynchronous type SRAM. In this case, the semiconductor memory device 100 has the memory cell array 200, where memory cells that require a refresh operation are arranged in a shaped of matrix and includes a control circuit for controlling the timing of the refresh operation by an internal signal independently of an external signal and executing control of the memory cell array in a non-normal operation mode different from the normal operation mode for writing data into the memory cell array 200 and reading out data from the memory cell array. In the semiconductor memory device 100, a plurality of bit lines of the memory cell array 200 are provided with a sense amplifier and I/O control circuit 123 and a column decoder 121, while a plurality of word lines of the memory cell array 200 are provided with a row decoder 122. Address data A0–A6 of the low-order seven bits are inputted to the column decoder 121 via a column address buffer memory 111 and used for controlling the bit lines. Moreover, address data A7–A20 of the high-order 14 bits are inputted to the row decoder 122 via a row address buffer memory 112 and used for controlling the word lines. On the other hand, data of low-order one byte inputted via data terminals DQ0–DQ7 are written into memory cells, which are in the memory cell array 200 and are connected to the word lines designated by the row decoder 122 via a low-order input buffer memory 131, the sense amplifier and I/O control circuit 123. Moreover, data of high-order one byte inputted via data terminals DQ8–DQ15 are written into memory cells, which are in the memory cell array 200 and are connected to the word lines designated by the row decoder 122 via a high-order input buffer memory 133, the sense amplifier and I/O control circuit 123. Further, the data of low-order one byte from the memory cells, which are in the memory cell array 200 and are connected to the word lines designated by the row decoder 122, are read out via the sense amplifier and I/O control circuit 123 and a low-order output buffer memory 132. On the other hand, the data of high-order one byte from the memory cells, which are in the memory cell array 200 and are connected to the word lines designated by the row decoder 122, are read out via the sense amplifier and I/O control circuit 123 and a low-order output buffer memory 134.

A test mode control circuit 180 detects entry into a test mode in accordance with the external control signals of a chip enable signal CE#, an output enable signal OE#, a write enable signal WE#, a low-order byte control signal LB#, a high-order byte control signal UB#, low-order address data A0–A6 from the column address buffer memory 111 and high-order address data A7–A20 from the row address buffer memory 112, generates a TMRASRESET signal for designating the test mode and outputs the generated TMRASRESET signal to the control signal generator circuit 150. A command mode control circuit 190 detects entry into a command mode in accordance with the external control signals of the chip enable signal CE#, the output enable signal OE#, the write enable signal WE#, the low-order byte control signal LB#, the high-order byte control signal UB#, the low-order address data A0–A6 from the column address buffer memory 111 and the high-order address data A7–A20 from the row address buffer memory 112, generates a CMEF signal for designating the command mode and outputs the generated CMEF signal to the control signal generator circuit 150. In this specification and the drawings, the marks # and Z given to each of the symbols of the signals indicate a low-enable signal, i.e., a signal for enabling or activating a circuit at the low level. Further, in accordance with the external control signals of the chip enable signal CE#, the output enable signal OE#, the write enable signal WE#, the low-order byte control signal LB#, the high-order byte control signal UB#, the low-order address data A0–A6 from the column address buffer memory 111 and the high-order address data A7–A20 from the row address buffer memory 112 as well as the TMRASRESET signal from the test mode control circuit 180 and the CMEF signal from the command mode control circuit 190, the control signal generator circuit 150 generates internal control signals for controlling the circuits 111, 112, 121, 122 and 131 to 134 of the semiconductor memory device 100 and outputs the internal control signals. The generation of the internal control signals will be described in detail later.

Figure 2:
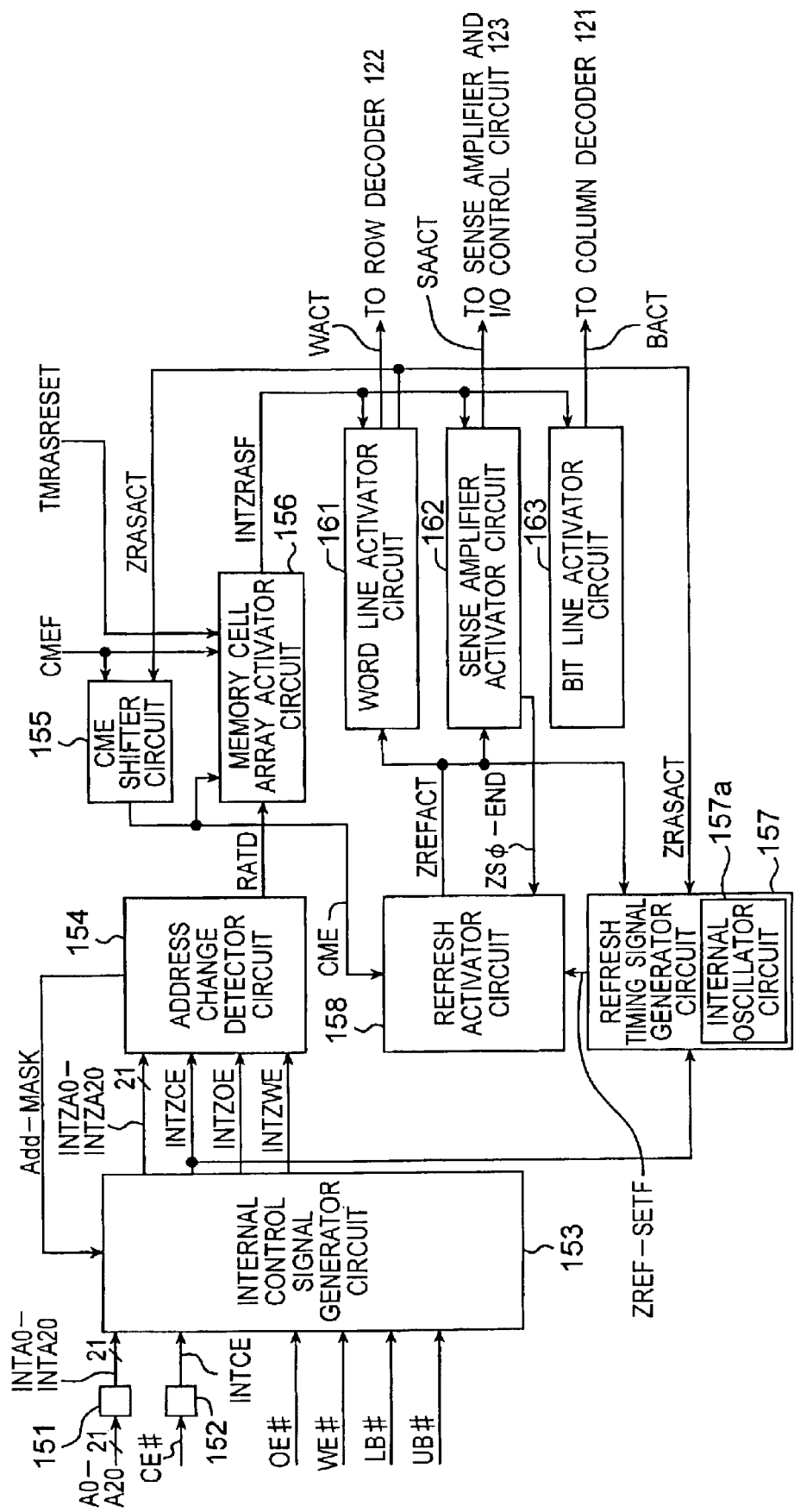
FIG. 2 is a block diagram showing a construction of a control signal generator circuit 150 of FIG. 1.

FIG. 2 is a block diagram showing a construction of the control signal generator circuit 150 of FIG. 1.

Referring to FIG. 2, the control signal generator circuit 150 is constructed of buffer memories 151 and 152, an internal control signal generator circuit 153, an address change detector circuit 154, a CME shifter circuit 155, a memory cell array activator circuit 156, a refresh timing signal generator circuit 157 provided with an internal oscillator circuit 157a, a word line activator circuit 161, a sense amplifier activator circuit 162, and a bit line activator circuit 163.

In the control signal generator circuit 150, the address data A0–A20 from an external apparatus are inputted as internal address data INTA0–INTA20 to the internal control signal generator circuit 153 via the buffer memory 151, while the chip enable signal CE# from the external apparatus is inputted as an internal chip enable signal INTCE to the internal control signal generator circuit 153 via the buffer memory 152. Moreover, the external control signals of the output enable signal OE#, the write enable signal WE#, the low-order byte control signal LB# and the high-order byte control signal UB# are inputted to the internal control signal generator circuit 153. The internal control signal generator circuit 153 generates internal address data INTZA0–INTZA20, an internal chip enable signal INTZCE, an output enable signal INTZOE and a write enable signal INTZWE in accordance with these input signals, and then, outputs these data and signals to an address change detector circuit 154. Among those signals, the internal chip enable signal INTZCE is outputted to the refresh timing signal generator circuit 157. Further, the address change detector circuit 154 detects a change in the address in accordance with the inputted internal address data INTZA0–INTZA20, generates an RATD signal of, for example, 5 nsec during detection, and then, outputs the generated RATD signal to the memory cell array activator circuit 156.

The CME shifter circuit 155 generates a CME signal obtained by delaying, for time shift, the CMEF signal from the command mode control circuit 190 by a predetermined time in accordance with the signal, and then, outputs the generated CME signal to the memory cell array activator circuit 156 and the refresh activator circuit 158. The memory cell array activator circuit 156 generates an INTZRASF signal, which is a memory cell array activation signal in the normal operation mode, in accordance with the TMRAS-RESET signal from the test mode control circuit 180, the CMEF signal from the command mode control circuit 190, the CME signal from the CME shifter circuit 155 and the RATD signal from the address change detector circuit 154, and then, outputs the generated these signals to the word line activator circuit 161, the sense amplifier activator circuit 162 and the bit line activator circuit 163.

Further, the refresh timing signal generator circuit 157 generates a predetermined reference refresh timing signal by an internal oscillator circuit 157a provided in its own circuit, thereafter generates a ZREF-SETF signal, which is refresh timing signal, in accordance with the INTZCE signal from the internal control signal generator circuit 153, a ZREFACT signal from the refresh activator circuit 158 and a ZRAS-ACT signal from the word line activator circuit 161, and then, outputs the generated these signals to the refresh activator circuit 158. In concrete, when the INTZCE signal is at a H-level, the refresh timing signal generator circuit 157 is subjected to hidden refresh and cyclically generates the ZREF-SETF of a one-shot pulse at a L-level, and outputs the on-shot pulse to the refresh activator circuit 158. When the INTZCE signal is at the L-level, the refresh timing signal generator circuit 157 is subjected to hidden refresh during the interval other than the read out and write intervals in the normal operation mode and cyclically generates the ZREF-SETF of a one-shot pulse having the L-level, and then, outputs the pulse to the refresh activator circuit 158. Moreover, the refresh timing signal generator circuit 157 generates the ZREF-SETF of a one-shot pulse having the L-level when the inputted ZREFACT signal is at the H-level during the hidden refresh interval, and then, outputs the one-shot pulse to the refresh activator circuit 158.

Further, the refresh activator circuit 158 generates a ZREFACT signal that becomes the H-level during the refresh interval in accordance with the ZREF-SETF signal, which is the refresh timing signal from the refresh timing signal generator circuit 157, a ZSφ-END signal, which represents the last timing of the sense amplifier operation and is outputted from the sense amplifier activator circuit 162, and the CME signal from the CME shifter circuit 155, and then, outputs these generated signals to the word line activator circuit 161, the sense amplifier activator circuit 162 and the refresh timing signal generator circuit 157. In this case, the ZREFACT signal is made to fall from the H-level to the L-level at the timing of ending the refresh interval, so that the set signal is not outputted.

Further, in accordance with the ZREFACT signal and the INTZRASF signal, the word line activator circuit 161 generates the ZRASACT signal, which is a signal of the result of OR operation of those signals, outputs the generated ZRASACT signal to the CME shifter circuit 155 and the refresh timing signal generator circuit 157, and also outputs a WACT signal, which is a word line activation signal for activating the word line, to the row decoder 122. Moreover, in accordance with the ZREFACT signal and the INTZRASF signal, the sense amplifier activator circuit 162 generates an SAACT signal, which is a sense amplifier activation signal for activating the sense amplifier, outputs the generated SAACT signal to the sense amplifier and I/O control circuit 123, generates the ZSφ-END signal, which represents the sense amplifier operation end timing, and outputs the generated ZSφ-END signal to the refresh activator circuit 158. Further, the bit line activator circuit 163 generates a BACT signal, which is a bit line activation signal for activating the bit line in response to the INTZRASF signal, and outputs the generated BACT signal to the row decoder 121.

Figure 3:
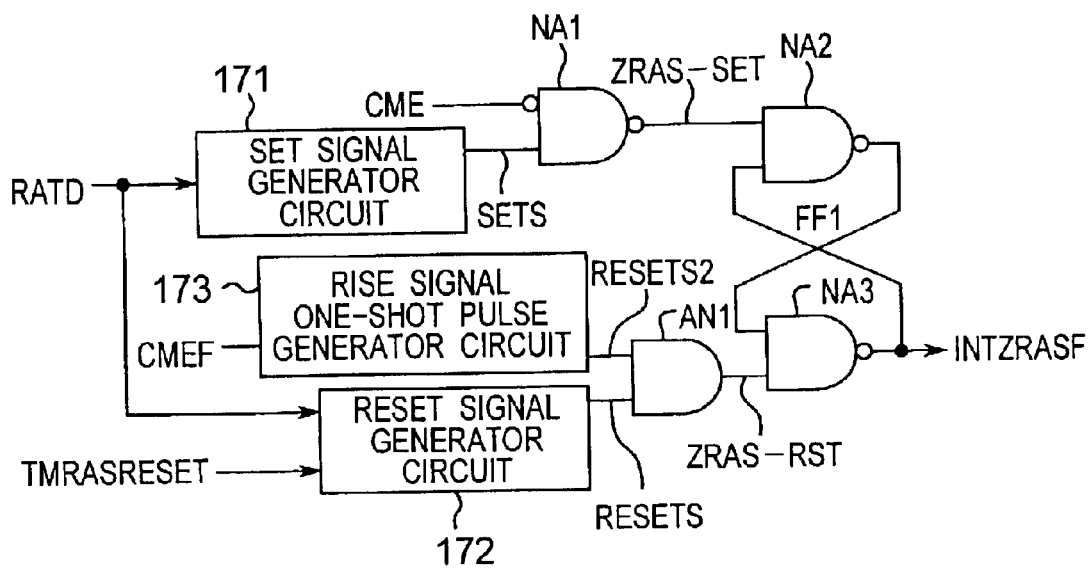
FIG. 3 is a block diagram showing a construction of a memory cell array activator circuit 156 of FIG. 2.

FIG. 3 is a block diagram showing a construction of the memory cell array activator circuit 156 of FIG. 2. Referring to FIG. 3, the CME signal from the CME shifter circuit 155 is inputted to the first inverted input terminal of a NAND gate NA1, and an RATD signal from the address change detector circuit 154 is inputted to the set signal generator circuit 171 and the reset signal generator circuit 172. The CMEF signal from the command mode control circuit 190 is inputted to a rise signal one-shot pulse generator circuit 173, and the TMRASRESET signal from the test mode control circuit 180 is inputted to the reset signal generator circuit 172. The set signal generator circuit 171 generates a SETS signal of an the H-level pulse by delaying the inputted RATD signal by a predetermined time in accordance with the signal, and then, outputs the generated SETS signal to the first input terminal of a NAND gate NA2 via the second input terminal of the NAND gate NA1. In this case, an output signal from the NAND gate NA1 is served as a ZRAS-SET signal. The rise signal one-shot pulse generator circuit 173 generates RESETS2, which is a one-shot pulse of a predetermined pulse interval in response to the inputted CMEF signal, and then, outputs the generated pulse signal to the second input terminal of a NAND gate NA3 via the first input terminal of an AND gate AN1. Further, the reset signal generator circuit 172 generates a RESETS signal of an the L-level pulse when the inputted TMRASRESET signal is at the L-level and the RATD signal of an the H-level pulse is inputted, and then, outputs the generated RESETS signal to the second input terminal of the NAND gate NA3 via the second input terminal of the AND gate AN1. In this case, the output signal from the AND gate AN1 is served as a ZRAS-RST signal.

An output signal from the NAND gate NA2 is inputted to the first input terminal of the NAND gate NA3, while the INTZRASF signal, which is an output signal from the NAND gate NA3, is fed back to the second input terminal of the NAND gate NA2. The two NAND gates NA2 and NA3 constructed as above constitute the so-called set-reset type flip-flop circuit FF1. In this case, the NAND gate NA1 is controlled so as not to make the ZRAS-SET signal have the L-level by the CME signal having the H-level. Moreover, although the ZRAS-RST signal, which is the reset signal having the H-level, is generated in accordance with the CMEF signal or the TMRASRESET signal, the ZRAS-RST signal is consistently maintained at the L-level in the other case. In the flip-flop circuit FF1, when the ZRAS-SET signal, which is the set signal having the L-level, is inputted, data having the L-level is set in the flip-flop circuit FF1 and the INTZRASF signal having the L-level is outputted. Next, by the input of the ZRAS-RST signal having the L-level, the flip-flop circuit FF1 is reset and the INTZRASF signal having the H-level is outputted. That is, the INTZRASF signal having the L-level is the signal for activating the memory cell array circuit including the decoder and the word lines, and the signal is maintained at the H-level in the test mode and the command mode.

The memory cell array activator circuit 156 constructed as above is provided for generating the INTZRASF signal, which is an internal activation signal responding to an external control signal and first generates a RESETS2 signal, which is a one-shot pulse at the leading edge, to reset the flip-flop circuit FF1 immediately after entry into the command mode. During the command mode, the CME signal becomes the H-level, and the INTZRASF signal, which is the internal activation signal for the memory cell array 200, is not generated.

Figure 4:
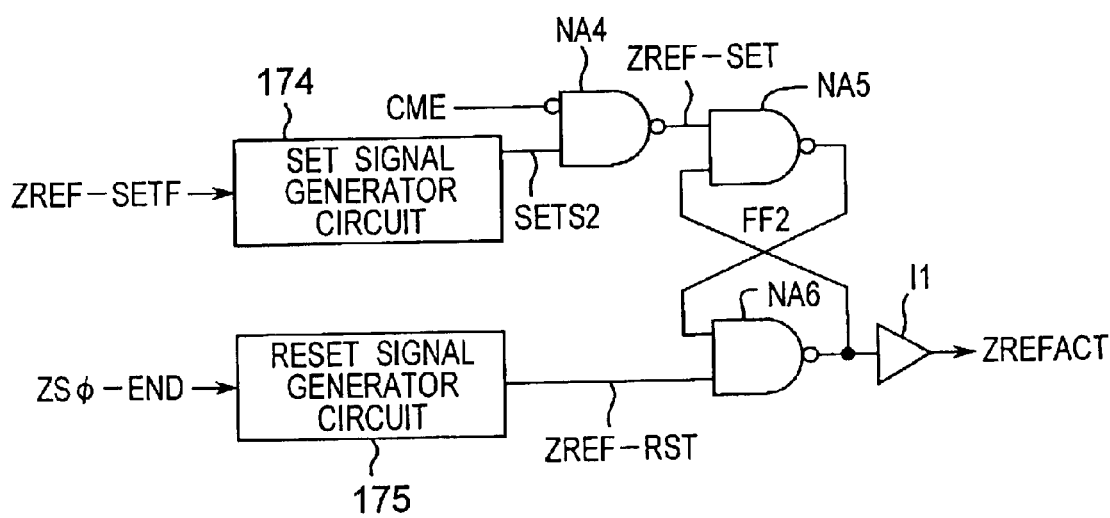
FIG. 4 is a block diagram showing a construction of a refresh activator circuit 158 of FIG. 2.

FIG. 4 is a block diagram showing a construction of the refresh activator circuit 158 of FIG. 2.

Referring to FIG. 4, the CME signal from the CME shifter circuit 155 is inputted to the first inverted input terminal of a NAND gate NA4, and the ZREF-SETF signal from the refresh timing signal generator circuit 157 is inputted to the set signal generator circuit 174. The ZSφ-END from the sense amplifier activator circuit 162 is inputted to the reset signal generator circuit 175. The set signal generator circuit 174 generates a SETS2 signal of an the H-level pulse by delaying the inputted ZREF-SETF signal by a predetermined time in accordance with the signal and outputs the generated SETS2 signal to the first input terminal of a NAND gate NA5 via the second input terminal of the NAND gate NA4. In this case, the output signal from the NAND gate NA5 is served as the ZREF-SET signal. The reset signal generator circuit 175 generates a REF-RST signal of an the L-level pulse in response to the ZSφ-END signal of an the L-level pulse, and then, outputs the generated REF-RST signal to the second input terminal of a NAND gate NA6. In this case, an output signal from the reset signal generator circuit 175 is served as a ZREF-RST signal.

An output signal from the NAND gate NA5 is inputted to the first input terminal of the NAND gate NA6, while an output signal from the NAND gate NA6 is fed back to the second input terminal of the NAND gate NA5. The output signal from the NAND gate NA6 is outputted as a ZREFACT signal via an inverter I1. The two NAND gates NA5 and NA6 constructed as above constitute the so-called set-reset type flip-flop circuit FF2. In this case, the NAND gate NA4 is controlled so as not to make the ZREF-SET signal have the L-level by the CME signal having the H-level. In the flip-flop circuit FF2, when the ZREF-SET signal, which is the set signal having the L-level, is inputted, data having the L-level is set in the flip-flop circuit FF2, and the ZREFACT signal having the H-level is outputted. Next, by the input of the ZREF-RST signal having the L-level, the flip-flop circuit FF2 is reset, and the ZREFACT signal having the L-level is outputted. That is, the ZREFACT signal is a signal that represents the refresh interval when the signal is at the L-level.

In the refresh activator circuit 158 constructed as above, the CME signal becomes the H-level during the command mode, and the L-level ZREFACT signal, which is a refresh execution signal, is not generated. Therefore, the data, which has already been written into the memory cell array 200, can be prevented from being destroyed during the command mode.

Figure 5:
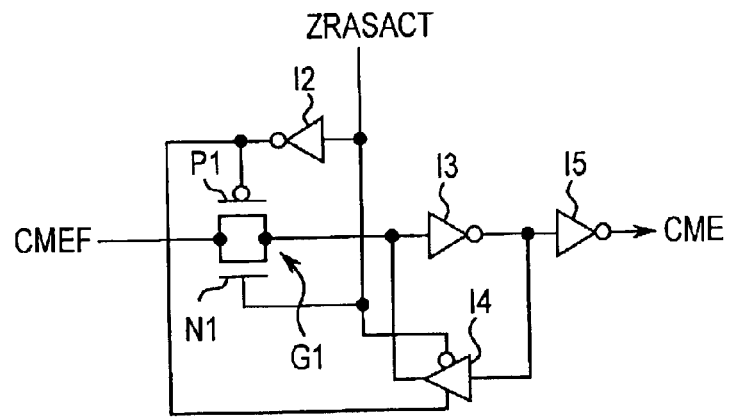
FIG. 5 is a circuit diagram showing a construction of a CME shifter circuit 155 of FIG. 2.

FIG. 5 is circuit diagram showing a construction of the CME shifter circuit 155 of FIG. 2.

Referring to FIG. 5, CME shifter circuit 155 constitutes a delay circuit with a gate circuit including the followings:

(a) a gate circuit G1 in which the source and drain of a P-channel field-effect transistor (hereinafter referred to as a P-channel FET) P1 are connected to the source and drain, respectively, of an N-channel field-effect transistor (hereinafter referred to as an N-channel FET) N1 in parallel; and (b) four inverters I2 to I5.

In this case, the operation of the inverter I4 is activated when the ZRASACT signal having the L-level is inputted, and the operation is stopped when the ZRASACT signal having the H-level is inputted. The ZRASACT signal from the sense amplifier activator circuit 162 is inputted to the gate of the inverted activation control terminal of the inverter I4 and the gate of the N-channel FET N1 and inputted to the gate of the P-channel FETP1 and the activation control terminal of the inverter I4 via the inverter I2. The CMEF signal from the control signal generator circuit 150 of FIG. 1 is outputted as the CME signal via the gate circuit G1, the inverter I3 and the inverter I5.

In the CME shifter circuit 155 constructed as above, the gate circuit G1 is opened when the ZRASACT signal is at the H-level. The CMEF signal is made to pass through the CME shifter circuit 155, delayed by a predetermined time, and thereafter, is outputted as the CME signal. When the ZRASACT signal is at the L-level, the gate circuit G1 is closed, as a consequence of which the CMEF signal is not propagated and the CME signal having the L-level is outputted. That is, the CME shifter circuit 155 constitutes a circuit that does not transmit the CMEF signal until the ZRASACT signal is inactivated.

Figure 6:
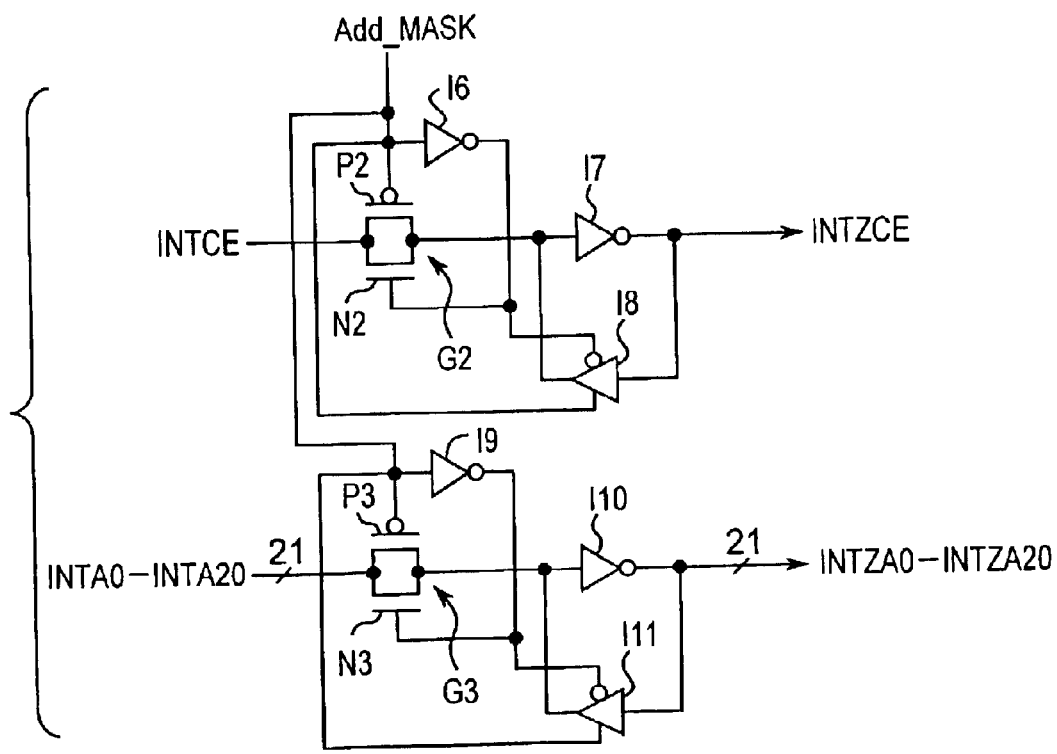
FIG. 6 is a circuit diagram showing a construction of a part of an internal control signal generator circuit 153 of FIG. 2.

FIG. 6 is a circuit diagram showing a construction of part of the internal control signal generator circuit 153 of FIG. 2.

Referring to FIG. 6, the internal control signal generator circuit 153 constitutes a delay circuit with a gate including the followings:

(a) a gate circuit G2 in which the source and drain of a P-channel FET P2 are connected to the source and drain, respectively, of an N-channel FET N2 in parallel; and (b) three inverters I6 to I8.

Further, the internal control signal generator circuit 153 constitutes a delay circuit with a gate including the followings:

(a) a gate circuit G3 in which the source and drain of a P-channel FET P3 are connected to the source and drain, respectively, of an N-channel FET N3 in parallel; and (b) three inverters I9 to I11.

In this case, the operation of the inverters I8 to I11 are activated when the Add-MASK signal having the H-level is inputted, and the operation is stopped when the Add-MASK signal having the L-level is inputted. The Add-MASK signal from the address change detector circuit 154 is inputted to the gates of P-channel FETs P2 and P3 and the activation control terminals of the inverters I8 and I11, inputted to the gate of the N-channel FET N2 and the inverted activation control terminal of the inverter I8 via the inverter I6 and inputted to the gate of the N-channel FET N3 and the inverted activation control terminal of the inverter I11 via the inverter I9. In this case, the INTCE signal is outputted as INTZCE via the gate circuit G2 and the inverter I7. Moreover, the 21-bit address data INTA0–INTA20 are outputted as inverted address data INTZA0–INTZA20 via the gate circuit G3 and the inverter I10.

In the internal control signal generator circuit 153 constructed as above, the gate circuits G2 and G3 are both opened when the Add-MASK signal is at the H-level. Consequently, the INTZCE signal is made to pass through the gate circuit G2, delayed by a predetermined time and thereafter outputted as the INTZCE signal. The address data INTZA0–INTZA20 are made to pass through the gate circuit G3, delayed by a predetermined time, and thereafter, is outputted as inverted address data INTA0–INTA20. On the other hand, the gate circuits G2 and G3 are both closed when the Add-MASK signal is at the L-level, consequently not allowing the INTCE signal and the address data INTA0–INTA20 to propagate and pass therethrough.

That is, the internal control signal generator circuit 153 is provided for executing control so as not to transmit the chip enable signal INTCE and the internal address data INTA0–INTA20 in accordance with the Add-MASK signal having the H-level.

Figure 7:
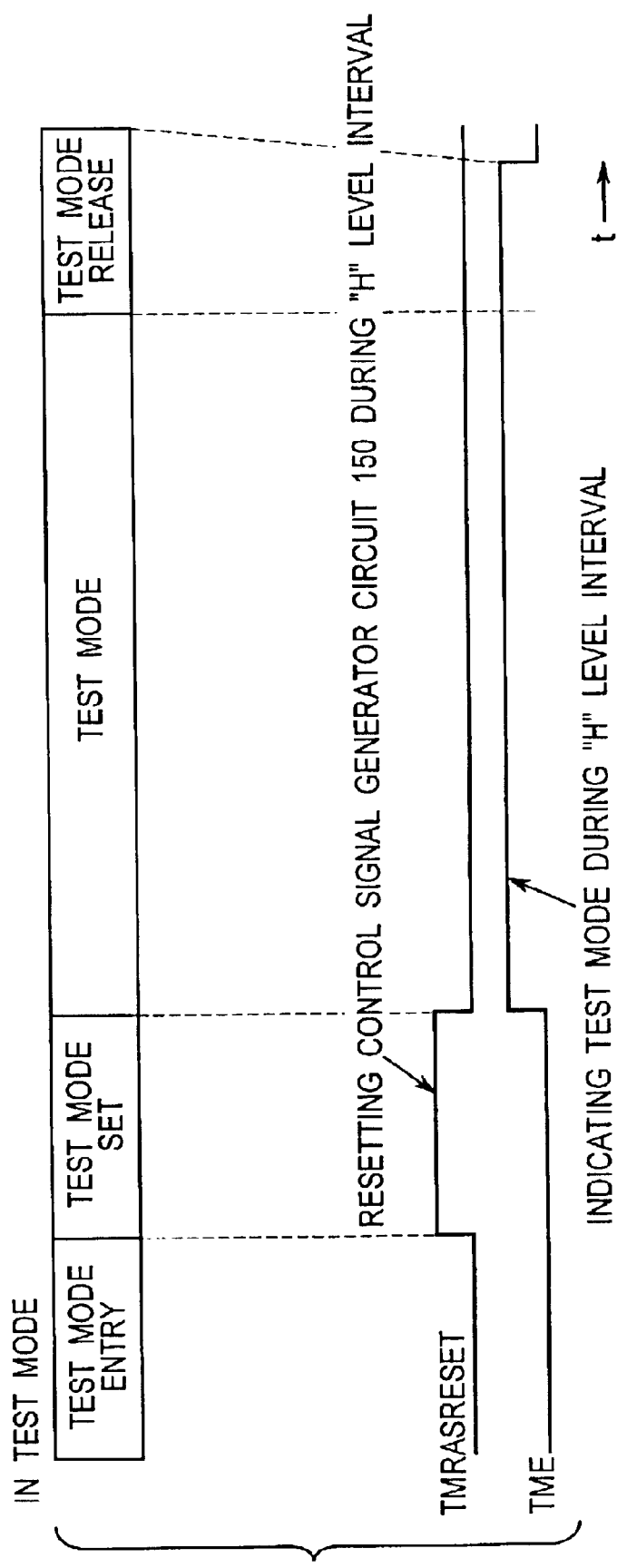
FIG. 7 is a timing chart showing an operation in a test mode of the semiconductor memory device 100 of FIG. 1.

FIG. 7 is a timing chart showing an operation in the test mode of the semiconductor memory device 100 of FIG. 1.

Referring to FIG. 7, an operation mode other than the normal read-out operation and write operation is referred to as a test mode. Various circuit functions can be measured by using the test mode. In order to execute the test mode, it is proper to execute specific entry operation for entry into a state in which the test mode is accepted and thereafter input a specific signal, allowing the test mode to be executed. FIG. 7 shows a flow from the entry into the test mode to the exit. For example, by inputting a predetermined address data pattern of eight cycles and applying an abnormal voltage of 6 V, which exceeds the normal voltage of 3 V at normal the H-level, to one of the address data pins, a test mode entry sequence is executed for the entry into the test mode. By designating a predetermined test mode with an input of, for example, an address data pattern of two cycles for the test mode setting, the corresponding arbitrary test mode is set. In the interval of this test mode setting, the TMRASRESET signal becomes the H-level, and the INTZRASF signal from the memory cell array activator circuit 156 becomes the H-level, consequently resetting the control signal generator circuit 150. Subsequently, the entry into the test mode is achieved when the TMRASRESET signal falls from the H-level to the L-level in the state in which the test mode is set. At this time, a TME signal, which represents the test mode, is maintained at the H-level, and various tests can be executed during the interval of the test mode. When the test mode is ended, by executing a test mode release sequence in response to, for example, the CE# signal having the L-level, the OE# signal having the H-level and the WE# signal having the H-level, exit from the test mode is achieved. At this time, the TME signal falls from the H-level to the L-level.

That is, the test mode setting of FIG. 7 is performed during the interval when the normal operation mode is changed to the test mode. Therefore, during the test mode setting interval, by activating the TMRASRESET signal to the H-level, the control signal generator circuit 150 is brought into an inactive state. That is, in the memory cell array activator circuit 156 of FIG. 3, by inputting the TMRASRESET signal to the reset portion of the set-reset type flip-flop FF1, the INTZRASF signal, which is the internal activation signal, is brought into the inactive state.

Figure 8:
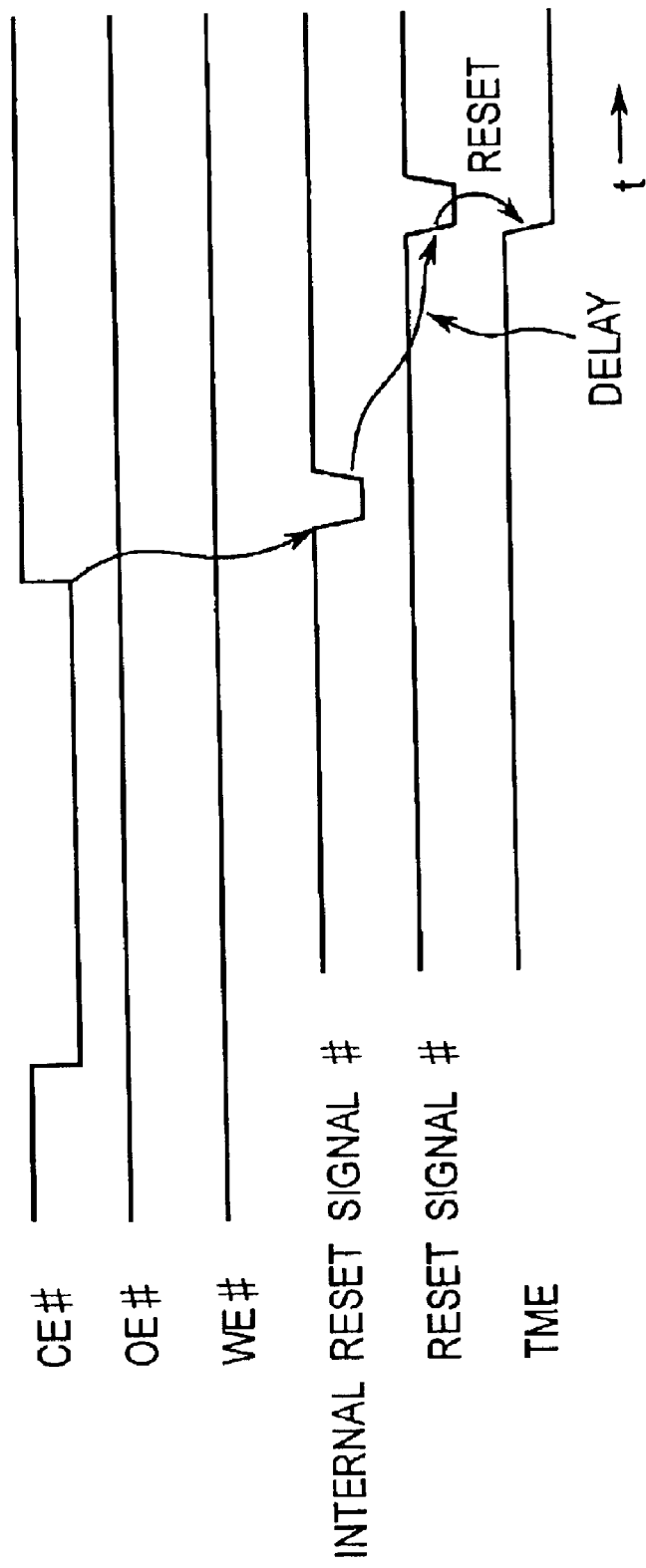
FIG. 8 is a timing chart showing an operation when the test mode is released in the semiconductor memory device 100 of FIG. 1.

FIG. 8 is a timing chart showing an operation when the test mode is released in the semiconductor memory device 100 of FIG. 1.

Referring to FIG. 8, a specified delay is provided for the exit from the test mode when the chip enable signal CE# rises, and the test mode is reset to make the TME signal fall from the H-level to the L-level. As a result, the test mode ends after a lapse of sufficient time from the completion without bringing the test mode operation to an end partway. The command mode is similar to the test mode. During the command mode, neither internal read-out operation nor write operation is executed.

Figure 9:
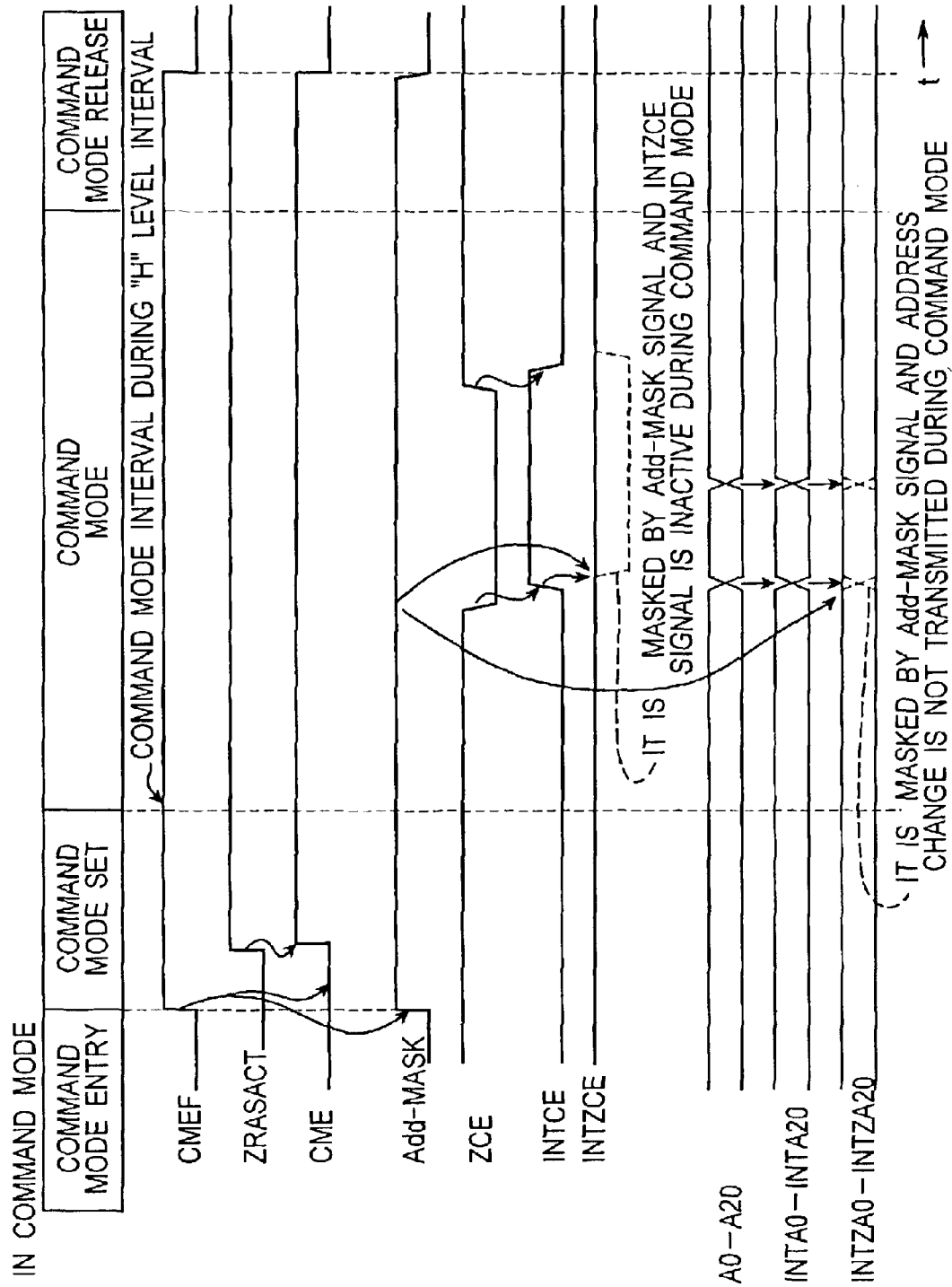
FIG. 9 is a timing chart showing an operation in a command mode of the semiconductor memory device 100 of FIG. 1.

FIG. 9 is a timing chart showing an operation in the command mode of the semiconductor memory device 100 of FIG. 1.

FIG. 9 shows a flow from the entry into the command mode to the exit from the command mode. The entry into the command mode is achieved by executing a command mode entry sequence by, for example, inputting the last address data (21-bit address data are all at the H-level) and reading data from the memory cell array 200 four times. At this time, the CMEF signal rises from the L-level to the H-level. In response to this, the Add-MASK signal becomes the H-level, and the ZRASACT signal rises, thereby setting the CME signal at the H-level. Next, by writing predetermined data into the memory cell array 200 during the command mode setting interval, the corresponding arbitrary command mode is set. Subsequently, various functions of, for example, a memory address hold block setting function can be set in a state in which the command mode is set. When the command mode ends, exit from the command mode is achieved by a command mode release process.

As shown in FIG. 9, a command mode activation signal CMEF having the H-level is generated after the completion of the command mode entry sequence. In this state, the entry into the command mode is not immediately achieved, and the command mode activation signal CME having the H-level is generated upon completing the entry sequence into the command mode by the internal activation signal ZRASACT during the command mode entry sequence. However, the apparatus input signal is controlled so as not to output the chip enable signal ZCE and the address data A0–A20 with the mask signal Add-MASK by the CMEF signal.

Figure 10:
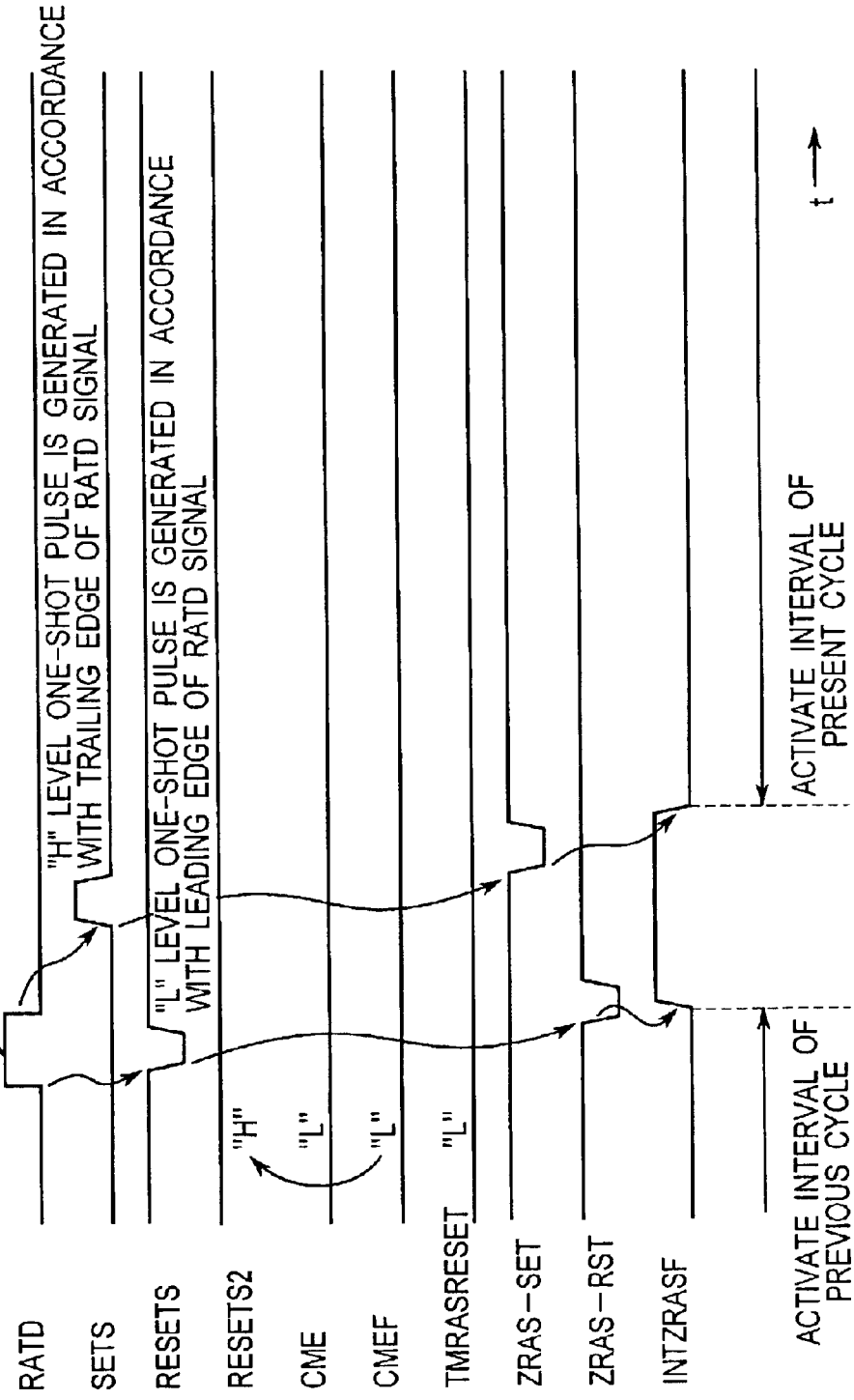
FIG. 10 is a timing chart showing an operation in the normal operation mode of the memory cell array activator circuit 156 of the semiconductor memory device 100 of FIG. 1.

FIG. 10 is a timing chart showing an operation in the normal operation mode of the memory cell array activator circuit 156 of the semiconductor memory device 100 of FIG. 1.

Referring to FIG. 10, the RATD signal, which is the H-level pulse, is generated upon detecting a change in the external address. In response to this, based on the trailing edge of the RATD signal, the RESETS signal, which is a one-shot pulse having the L-level, is outputted. In response to this, the ZRAS-RST signal of an the L-level pulse is generated, and the INTZRASF signal rises from the L-level to the H-level in response to this. On the other hand, in response to the trailing edge of the RATD signal falling from the H-level to the L-level, the SETS signal, which is a one-shot pulse having the H-level, is generated. In response to this, the ZRAS-SET signal, which is the L-level pulse, is generated, and the INTZRASF signal next falls from the H-level to the L-level in response to this. In this case, an interval to the leading edge of the INTZRASF signal rising to the H-level is the activation interval of the memory cell array 200 of the previous cycle, while an interval to the trailing edge of the INTZRASF signal falling to the L-level is the activation interval of the memory cell array 200 of the present cycle.

Figure 11:
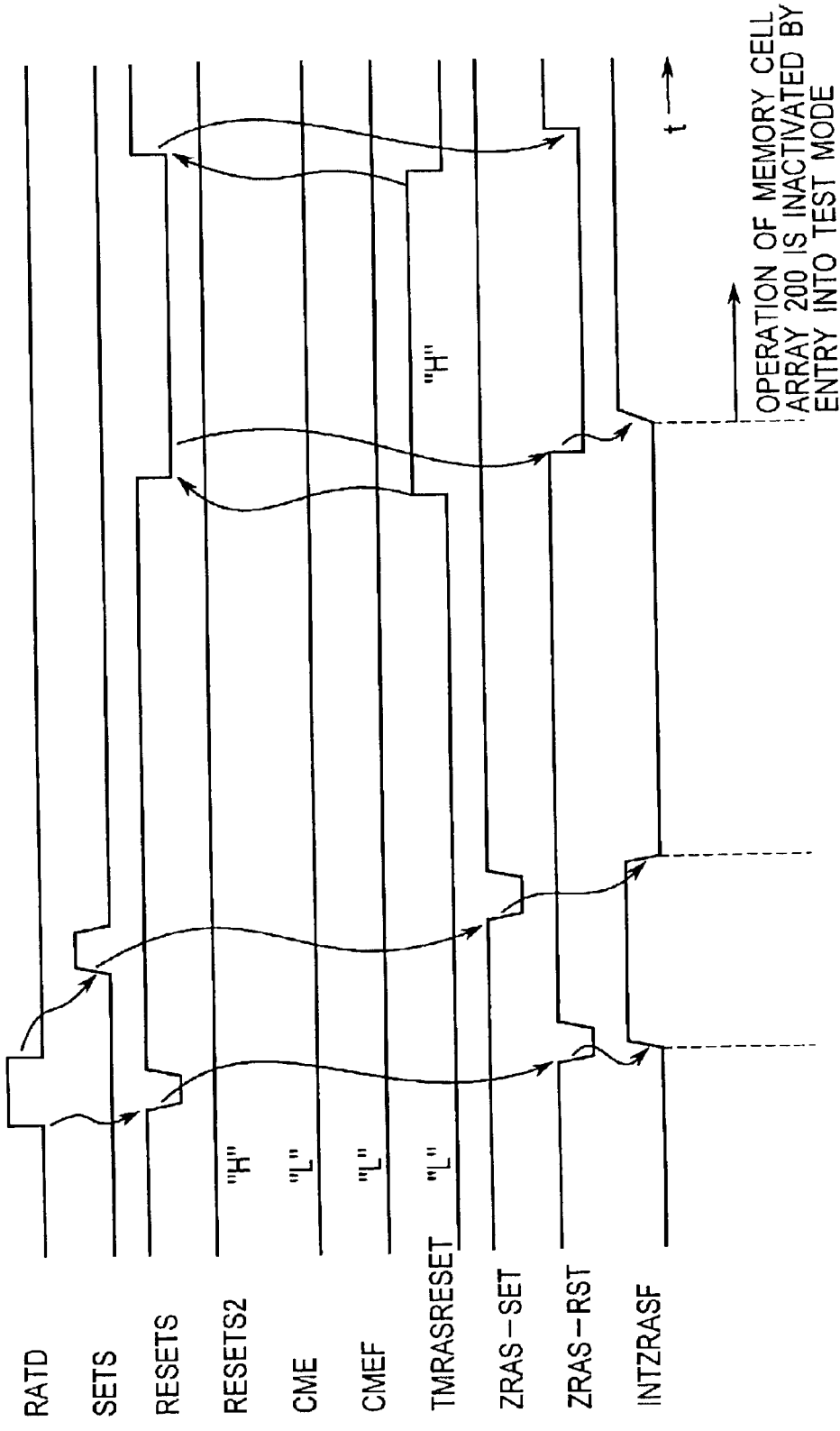
FIG. 11 is a timing chart showing an operation in the test mode of the memory cell array activator circuit 156 of the semiconductor memory device 100 of FIG. 1.

FIG. 11 is a timing chart showing an operation in the test mode of the memory cell array activator circuit 156 of the semiconductor memory device 100 of FIG. 1.

Referring to FIG. 11, the RESETS signal, which is a one-shot pulse having the L-level, is generated in response to the leading edge of the RATD signal, and the ZRAS-RST signal, which is a one-shot pulse having the L-level, is generated in accordance with this. In accordance with this, the INTZRASF signal is reset to the H-level. Next, in response to the trailing edge of the RATD signal, the SETS signal, which is a one-shot pulse having the H-level, is generated. In accordance with this, the ZRAS-SET signal, which is a one-shot pulse having the L-level, is generated, and the INTZRASF signal falls from the H-level to the L-level at this time. Further, the RESTS signal becomes the L-level during the interval when the TMRASRESET signal is at the H-level. In accordance with this, the ZRAS-RST signal becomes the L-level, and the INTZRASF signal rises from the L-level to the H-level at this time. As a result, the operation of the memory cell array 200 is inactivated by the entry into the test mode. Accordingly, the operation of the memory cell array 200 is inactivated in the test mode. Therefore, the data, which have previously been written in the normal operation, are maintained as they are, preventing the data from being destroyed.

Figure 12:
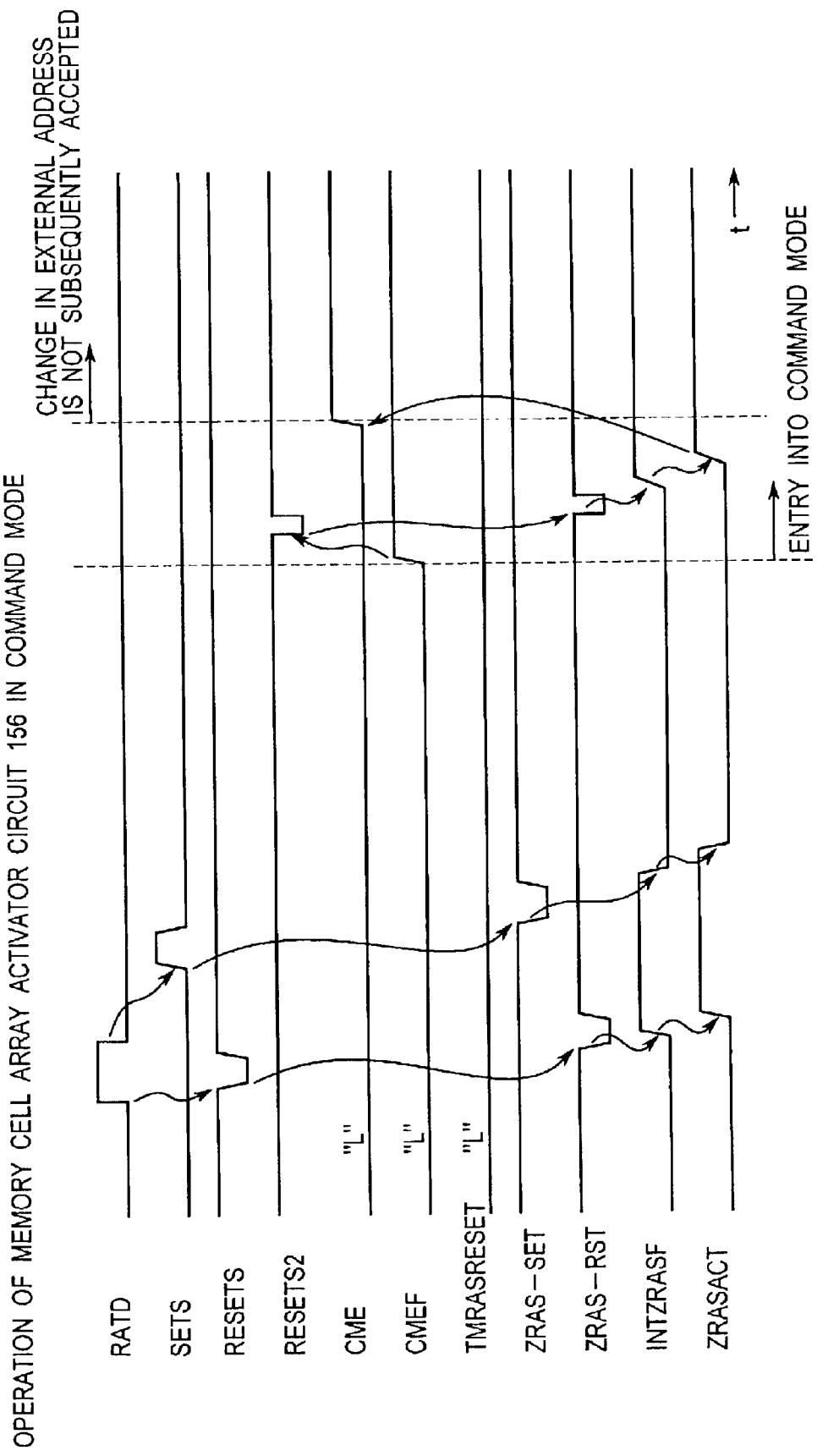
FIG. 12 is a timing chart showing an operation in the command mode of the memory cell array activator circuit 156 of the semiconductor memory device 100 of FIG. 1.

FIG. 12 is a timing chart showing an operation in the command mode of the memory cell array activator circuit 156 of the semiconductor memory device 100 of FIG. 1.

Referring to FIG. 12, the RESETS signal, which is a one-shot pulse having the L-level, is generated in response to the leading edge of the RATD signal, and the ZRAS-RST signal, which is a one-shot pulse having the L-level, is generated in accordance with this. In accordance with this, the INTZRASF signal is reset to the H-level, and the ZRASACT signal having the H-level is outputted. Next, in response to the trailing edge of the RATD signal, the SETS signal, which is a one-shot pulse having the H-level, is generated. In accordance with this, the ZRAS-SET signal, which is a one-shot pulse having the L-level, is generated. At this time, the INTZRASF signal falls from the H-level to the L-level, and the INTRASACT signal falls from the H-level to the L-level in a similar manner. Next, when the CMEF signal rises from the L-level to the H-level in the command mode entry process, the RESETS2 signal of an the L-level pulse is generated in response to this, and in accordance with this, the ZRASRST signal, which is an the L-level pulse, is generated. Thereafter, the INTZRASF signal rises from the L-level to the H-level, and the ZRASACT signal rises from the L-level to the H-level. As a result, the CME signal rises from the L-level to the H-level, and subsequently is achieved entry into a state in which no change in the five addresses is accepted. Therefore, the data, which have previously been written in the normal operation, are maintained as they are, preventing the data from being destroyed.

Figure 13:
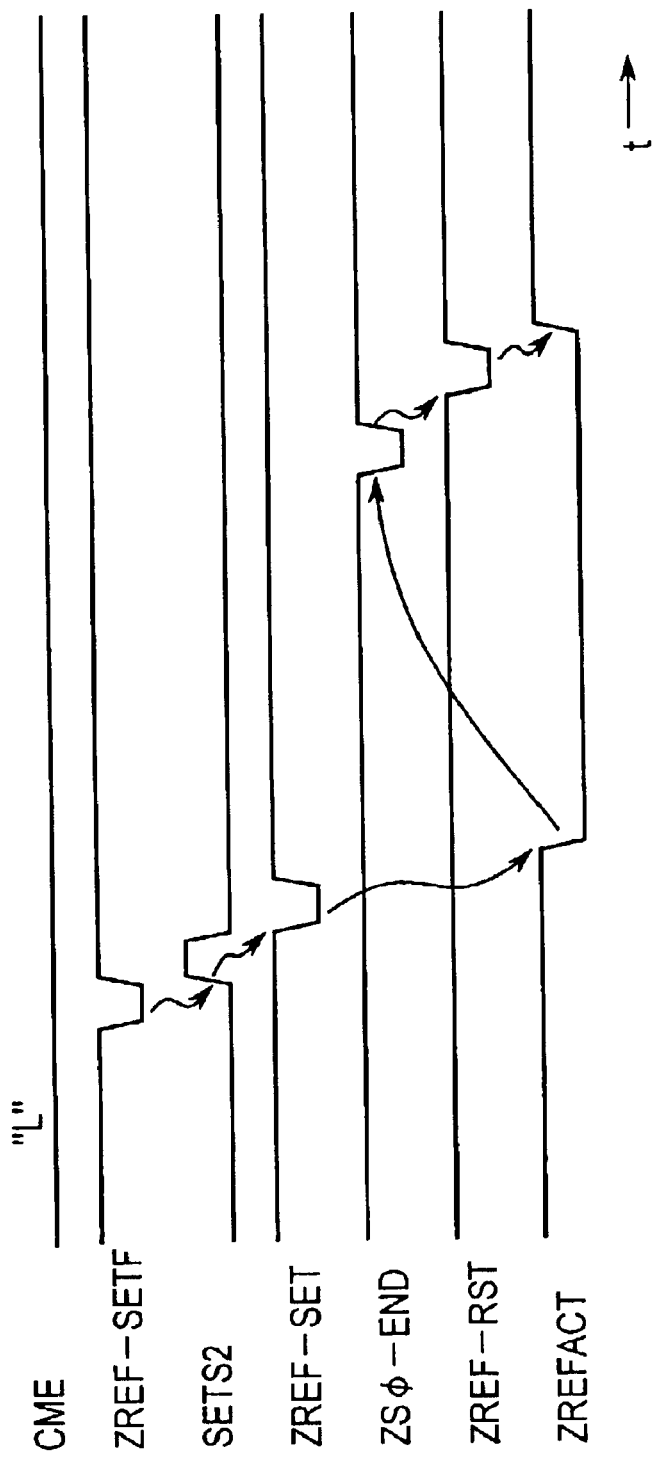
FIG. 13 is a timing chart showing an operation in the normal operation mode of a refresh activator circuit 158 of the semiconductor memory device 100 of FIG. 1.

FIG. 13 is a timing chart showing an operation in the normal operation mode of the refresh activator circuit 158 of the semiconductor memory device 100 of FIG. 1.

Referring to FIG. 13, the SETS2 signal of an the H-level pulse is generated in response to the ZREF-SETF signal of an the L-level pulse, and thereafter, the ZREF-SET signal of the L-level pulse is generated. In accordance with this, the ZREFACT signal falls from the H-level to the L-level, and subsequently, the ZSφ-END signal, which is the L-level pulse, is generated. In response to this, the ZREF-RST signal of an the L-level pulse is generated, and the ZREFACT signal rises from the L-level to the H-level. As a result, the refresh operation of the memory cell array 200 is activated.

Figure 14:
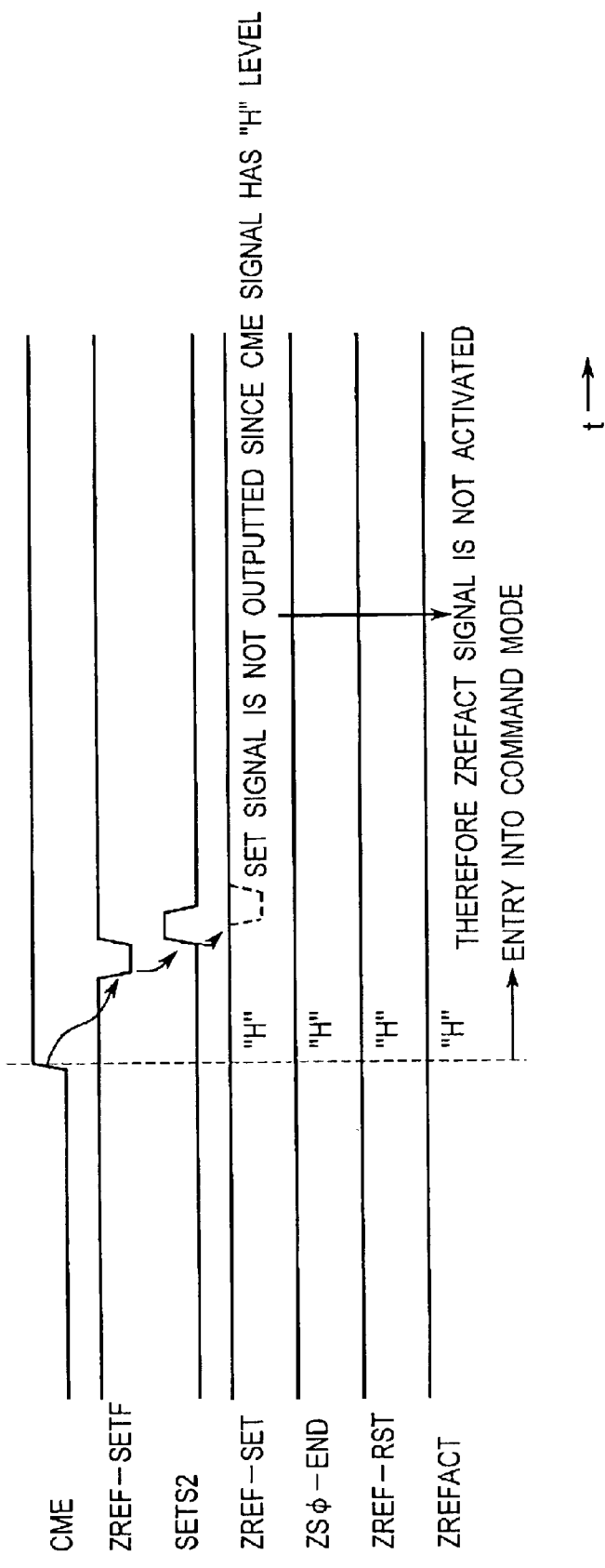
FIG. 14 is a timing chart showing an operation in the command mode of the refresh activator circuit 158 of the semiconductor memory device 100 of FIG. 1.

FIG. 14 is a timing chart showing an operation in the command mode of the refresh activator circuit 158 of the semiconductor memory device 100 of FIG. 1.

Referring to FIG. 14, when the CME signal rises from the L-level to the H-level, the ZREF-SETF signal, which is the L-level pulse, is generated. In accordance with this, the SETS2 signal of an the H-level pulse is generated. At this time, since the CME signal is at the H-level, the ZREF-SET signal having the L-level is not generated, and therefore, the ZREFACT signal having the L-level is not generated. Therefore, the memory cell array 200 is not refreshed in the command mode, and the data, which have previously been written in the normal operation, are maintained as they are in the command mode, preventing the data from being destroyed.

As described above, according to the present preferred embodiments, in response to the sequence of entry into the non-normal operation mode such as the test mode and the command mode based on the predetermined command signal, the non-normal operation mode is started. After the non-normal operation mode is set in response to the sequence of setting the non-normal operation mode based on another predetermined command signal, the operation of the set non-normal operation mode is executed in correspondence. Subsequently, control is executed so as to release the non-normal operation mode by the non-normal operation mode release process based on another predetermined command signal, and control is executed so as to prohibit the activation process of the memory cell array during the interval when the non-normal operation mode is set. Therefore, the result of the execution of write in the normal operation mode can be prevented from being destroyed even in the state on the way to the entry into the operation mode of, for example, the test mode or the command mode, different from the normal operation mode. Moreover, in this case, the control circuit can be prevented from entering a freeze state in which the circuit is uncontrollable due to the timing shift of the plurality of internal control signals.

In the aforementioned preferred embodiment, neither write into the memory cell array 200 nor the refresh of the memory cell array is executed in the operation mode such as the test mode or the command mode different from the normal operation mode, and the data that have previously been written in the normal operation mode are maintained as they are, allowing the data to be prevented from being destroyed. In this case, the operation mode different from the normal operation mode is limited to neither of the test mode and the command mode, and the operation mode may be another operation mode different from the normal operation mode.

Advantageous Effects of Preferred Embodiments

As described in detail above, according to the semiconductor memory device of the present preferred embodiments, there is provided a semiconductor memory device equipped with a memory cell array including memory cells being arranged in a shape of matrix and requiring a refresh operation. In the semiconductor memory device, a control means controls a timing of the refresh operation in accordance with an internal signal independently of an external signal and controlling the memory cell array in a non-normal operation mode different from a normal operation mode for writing data into the memory cell array and reading out data from the memory cell array. The control means starts the non-normal operation mode in response to a sequence of entry into the non-normal operation mode based on a predetermined first command signal, sets the non-normal operation mode in response to a sequence of setting the non-normal operation mode based on a predetermined second command signal, and thereafter, executes operation of the corresponding non-normal operation mode which is set. Accordingly, the result of execution of write in the normal operation can be prevented from being destroyed even in the state on the way to the entry into the operation mode of, for example, the test mode or the command mode, which is different from the normal operation mode. Moreover, in this case, the control circuit can be prevented from entering the freeze state in which the circuit is uncontrollable due to the timing shift of the plurality of internal control signals.

In the above-mentioned semiconductor memory device, the control means preferably controls the memory cell array so as to release the non-normal operation mode by executing a non-normal operation mode release process based on a predetermined third command signal and so as to prohibit an enabling process for enabling the memory cell array during an interval when the non-normal operation mode is set. Accordingly, the result of execution of write in the normal operation can be prevented from being destroyed even in the state on the way to the entry into the operation mode of, for example, the test mode or the command mode, which is different from the normal operation mode. Moreover, in this case, the control circuit can be prevented from entering the freeze state in which the circuit is uncontrollable due to the timing shift of the plurality of internal control signals.

In the above-mentioned semiconductor memory device, the non-normal operation mode is a test mode, and the control means preferably resets the test mode after a lapse of a predetermined delay time from the timing when the test mode is released by the test mode release process. Accordingly, the result of execution of write in the normal operation can be prevented from being destroyed even in the state on the way to the entry into, for example, the test mode. Moreover, in this case, the control circuit can be prevented from entering the freeze state in which the circuit is uncontrollable due to the timing shift of the plurality of internal control signals.

In the above-mentioned semiconductor memory device, the non-normal operation mode is a command mode, and the control means preferably prohibits from writing data into the memory cell array and from reading out data from the memory cell array during an interval when the command mode is set. Accordingly, the result of execution of write in the normal operation can be prevented from being destroyed even in the state on the way to the entry into, for example, the command mode. Moreover, in this case, the control circuit can be prevented from entering the freeze state in which the circuit is uncontrollable due to the timing shift of the plurality of internal control signals.

In the above-mentioned semiconductor memory device, the control means preferably prohibits a refresh process for the memory cell array during an interval when the command mode is set. Accordingly, the result of execution of write in the normal operation can be prevented from being destroyed in, for example, the command mode. Moreover, in this case, the control circuit can be prevented from entering the freeze state in which the circuit is uncontrollable due to the timing shift of the plurality of internal control signals.

In the above-mentioned semiconductor memory device, the control means preferably starts the command mode in response to a sequence of entry into the command mode based on a predetermined fourth command signal, generates an address mask signal in response to the start of the command mode, and prohibits transmission of a chip enable signal and address data to an internal circuit of the semiconductor memory device in accordance with the address mask signal. Accordingly, the result of execution of write in the normal operation can be prevented from being destroyed in, for example, the command mode. Moreover, in this case, the control circuit can be prevented from entering the freeze state in which the circuit is uncontrollable due to the timing shift of the plurality of internal control signals. As a result, the malfunction of the control circuit can be avoided.

In the above-mentioned semiconductor memory device, the control means preferably includes a memory cell array activator circuit having a first set-reset type flip-flop circuit. In this case, the control means preferably starts the non-normal operation mode by setting the first set-reset type flip-flop circuit in response to the sequence of entry into the non-normal operation mode based on the predetermined first command signal, thereafter sets the non-normal operation mode by resetting the first set-reset type flip-flop circuit in response to the sequence of setting the non-normal operation mode based on the predetermined second command signal and subsequently prohibits the activation process for the memory cell array during the interval when the non-normal operation mode is set. Accordingly, the result of the execution of write in the normal operation mode can be prevented from being destroyed even in the state on the way to the entry into the operation mode of, for example, the test mode or the command mode, which is different from the normal operation mode. Moreover, in this case, the control circuit can be prevented from entering the freeze state in which the circuit is uncontrollable due to the timing shift of the plurality of internal control signals. Furthermore, the circuit construction can easily be manufactured with the flip-flop circuit employed.

In the above-mentioned semiconductor memory device, the control means preferably includes a refresh activator circuit having a second set-reset type flip-flop circuit. In this case, the control means preferably starts the command mode by setting the second set-reset type flip-flop circuit in response to the sequence of entry into the command mode based on the predetermined fourth command signal, thereafter prohibits the refresh process of the memory cell array, and restarts the refresh process of the memory cell array by resetting the second set-reset type flip-flop circuit when the command mode is released. Accordingly, the result of the execution of write in the normal operation mode can be prevented from being destroyed even in the state on the way to the entry into the operation mode of, for example, the command mode which is different from the normal operation mode. Moreover, in this case, the control circuit can be prevented from entering the freeze state in which the circuit is uncontrollable due to the timing shift of the plurality of internal control signals. Furthermore, the circuit construction can easily be manufactured with the flip-flop circuit employed.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor memory device comprising:
    a memory cell array including memory cells being arranged in a shape of matrix and requiring a refresh operation; and
    control means for controlling a timing of the refresh operation in accordance with an internal signal independently of an external signal and controlling said memory cell array in a non-normal operation mode different from a normal operation mode for writing data into said memory cell array and reading out data from said memory cell array,
    wherein said control means starts the non-normal operation mode in response to a sequence of entry into the non-normal operation mode based on a predetermined first command signal, sets the non-normal operation mode in response to a sequence of setting the non-normal operation mode based on a predetermined second command signal, and thereafter, executes operation of the corresponding non-normal operation mode which is set.

2. The semiconductor memory device according to claim 1,
    wherein said control means controls said memory cell array so as to release the non-normal operation mode by executing a non-normal operation mode release process based on a predetermined third command signal and so as to prohibit an enabling process for enabling said memory cell array during an interval when the non-normal operation mode is set.

3. The semiconductor memory device according to claim 2,
    wherein the non-normal operation mode is a test mode, and said control means resets the test mode after a lapse of a predetermined delay time from the timing when the test mode is released by the test mode release process.

4. The semiconductor memory device according to claim 2,
    wherein the non-normal operation mode is a command mode, and the control means prohibits from writing data into said memory cell array and from reading out data from said memory cell array during an interval when the command mode is set.

5. The semiconductor memory device according to claim 4,
    wherein said control means prohibits a refresh process for said memory cell array during an interval when the command mode is set.

6. The semiconductor memory device according to claim 4,
    wherein said control means starts the command mode in response to a sequence of entry into the command mode based on a predetermined fourth command signal, generates an address mask signal in response to the start of the command mode, and prohibits transmission of a chip enable signal and address data to an internal circuit of said semiconductor memory device in accordance with the address mask signal.

7. The semiconductor memory device according to claim 1,
    wherein said control means comprises a memory cell array activator circuit having a first set-reset type flip-flop circuit, and
    wherein said control means starts the non-normal operation mode by setting said first set-reset type flip-flop circuit in response to the sequence of entry into the non-normal operation mode based on the first command signal, thereafter sets the non-normal operation mode by resetting said first set-reset type flip-flop circuit in response to the sequence of setting the non-normal operation mode based on the second command signal and subsequently prohibits the activation process for said memory cell array during the interval when the non-normal operation mode is set.

8. The semiconductor memory device according to claim 4,
    wherein said control means comprises a refresh activator circuit having a second set-reset type flip-flop circuit, and
    wherein said control means starts the command mode by setting said second set-reset type flip-flop circuit in response to the sequence of entry into the command mode based on the fourth command signal, thereafter prohibits the refresh process of said memory cell array, and restarts the refresh process of said memory cell array by resetting said second set-reset type flip-flop circuit when the command mode is released.

* * * * *